US006763512B2

(12) United States Patent
Xing

(10) Patent No.: US 6,763,512 B2
(45) Date of Patent: Jul. 13, 2004

(54) DETAILED METHOD FOR ROUTING CONNECTIONS USING TILE EXPANSION TECHNIQUES AND ASSOCIATED METHODS FOR DESIGNING AND MANUFACTURING VLSI CIRCUITS

(75) Inventor: Zhaoyun Xing, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 201 days.

(21) Appl. No.: 10/119,173

(22) Filed: Apr. 8, 2002

(65) Prior Publication Data

US 2003/0009737 A1 Jan. 9, 2003

Related U.S. Application Data

(60) Provisional application No. 60/281,926, filed on Apr. 6, 2001.

(51) Int. Cl.[7] .............................................. G06F 17/50
(52) U.S. Cl. .............................. 716/13; 716/16; 716/7; 716/5
(58) Field of Search ............................... 716/13, 16, 7, 716/5

(56) References Cited

U.S. PATENT DOCUMENTS

| | | | | |
|---|---|---|---|---|
| 4,484,292 A | * | 11/1984 | Hong et al. .................. 716/13 |
| 5,787,010 A | * | 7/1998 | Schaefer et al. ............... 716/7 |
| 5,818,730 A | * | 10/1998 | Young ......................... 716/14 |
| 5,822,214 A | * | 10/1998 | Rostoker et al. .............. 716/10 |
| 5,856,927 A | * | 1/1999 | Greidinger et al. ........... 716/12 |
| 6,002,857 A | * | 12/1999 | Ramachandran ............. 716/14 |
| 6,071,315 A | | 6/2000 | Ramamurthi et al. ......... 716/19 |
| 6,209,123 B1 | * | 3/2001 | Maziasz et al. ............... 716/14 |
| 6,223,332 B1 | * | 4/2001 | Scepanovic et al. .......... 716/10 |
| 6,324,673 B1 | | 11/2001 | Luo et al. ..................... 716/11 |
| 6,446,239 B1 | * | 9/2002 | Markosian et al. ............ 716/2 |
| 6,467,074 B1 | * | 10/2002 | Katsioulas et al. ........... 716/17 |
| 6,567,967 B2 | * | 5/2003 | Greidinger et al. ........... 716/10 |
| 6,642,556 B2 | * | 11/2003 | Ulrey ......................... 257/208 |
| 6,665,852 B2 | * | 12/2003 | Xing et al. ................... 716/12 |
| 2002/0104061 A1 | * | 8/2002 | Xing et al. .................... 716/4 |

OTHER PUBLICATIONS

Tsai et al., "An H–V Alternating Router", IEEE Transacations on Computer–Aided Design of Integrated Circuits and Systems, Vo 11, No. 8, Aug. 1992, pp. 976–991.*
Frezza et al., "SPAR: A Schematic Place and Route System", IEEE Transactions on Computer–Aided Design of Integrated Circuits and Systems, Vol. 12, No. 7, Jul. 1993, pp. 956–973.*
Lee et al., "A Gridless Area Router for Multichip Module Design", 42nd Midwest Symposium on Circuits and Systems, Aug. 8, 1999, Vol. 1, pp. 206–209.*
Sarrafzadeh et al., "Single–Layer Global Routing", IEEE Transactions on Computer–Aided Design of Integrated Circuits and Systems, Vol. 13, No. 1, Jan. 1994, pp. 38–47.*
Chow et al., "The Design of a SRAM–Based Field–Programmable Gate Array—Part II: Circuit Design and Layout", IEEE Transactions on Very Large Scale Integration (VLSI) Systems, Vol. 7, No. 3, Sep. 1999, pp. 321–330.*

(List continued on next page.)

Primary Examiner—Matthew Smith
Assistant Examiner—Phallaka Kik
(74) Attorney, Agent, or Firm—Meyertons Hood Kivlin Kowert & Goetzel, P.C.; B. Noël Kivlin

(57) ABSTRACT

Disclosed herein is a method and associated apparatus for the design and manufacture of VLSI circuit which incorporates therein a method for routing connections between component tiles of the VLSI circuit being designed.

15 Claims, 7 Drawing Sheets

OTHER PUBLICATIONS

Leijten–Nowak et al., "Architecture and Implementation of an Embedded Reconfigurable Logic Core in CMOS 0.13/spl mu/m", 15th Annual IEEE International ASIC/SOC Conference, Sep. 25, 2002, pp. 3–7.*

Yen et al., "Strategies for Mapping Lee's Maze Routing Algorithm onto Parallel Architectures", 1993 Proceedings of Seventh International Parallel Processing Symposium, Apr. 13, 1993, pp. 672–679.*

NB82123853, "Connecting Three Points While Minimizing Cost", IBM Technical Disclosure Bulletin, Vol. 25, No. 7B, pp. 3853–3858 (7 pages).*

Xing et al.; U.S. patent Ser. No. 10/109,116; Filed Mar. 28, 2002.

Xing et al.; U.S. patent Ser No. 10/109,125; Filed Mar. 28, 2002.

* cited by examiner

DETAILED METHOD FOR ROUTING CONNECTIONS USING TILE EXPANSION TECHNIQUES AND ASSOCIATED METHODS FOR DESIGNING AND MANUFACTURING VLSI CIRCUITS

CROSS REFERENCE TO RELATED APPLICATIONS

This application claims priority based upon U.S. Provisional Patent Application Ser. No. 60/281,926 filed Apr. 6, 2001.

This application is also related to U.S. patent application Ser. No. 10/109,125, now U.S. Patent Application Publication No. 20030188281, entitled "A Maximal Tile Generation Technique and Associated Methods of Designing and Manufacturing VLSI Circuits" and Ser. No. 10/109,116, now U.S. Patent Application Publication No. 20030188270, entitled "Active Region Management Techniques and Associated Methods of Designing and Manufacturing VLSI Circuits", both of which were filed on Mar. 28, 2002, assigned to the Assignee of the present application and hereby incorporated by reference as if reproduced in their entirety.

BACKGROUND

1. Technical Field

This relates to the design and manufacture of very large scale integrated ("VLSI") circuits and, more particularly, to a method for routing connections between component tiles of a VLSI circuit suitable for use in conjunction with the design and manufacture of VLSI circuits.

2. Description of the Relevant Art

A VLSI circuit is typically composed of a plurality of generally horizontal layers, each layer having a plurality of generally rectangular shaped components positioned thereon. VLSI circuit designers commonly refer to these generally rectangular shaped components as "component tiles" and to the rectangular shaped open spaces that surround the component tiles as "space tiles." Component tiles that are to be connected on a VLSI circuit are said to form a "net", while any component tile not connected to a particular net is considered to be an obstruction to that net. Two tiles are said to be "adjacent" if they touch along their edges and "overlapping" if there is even a single point located within the interior of both tiles. A set of tiles positioned within a routing area is said to be "maximal" if no two tiles are either overlapping or adjacent on their left or right edges.

One step in the design of a VLSI circuit is to select the wire paths that extend through the space tiles to connect the electrically equivalent component tiles that form nets. A current technique used to determine these paths utilizes a tile expansion algorithm. More specifically, clear space around the component tiles forming a net is fractured into maximal space tiles. Adjoining ones of these maximal space tiles are used to define the most efficient tile path between two components. The path of the actual connection between the components, known as the wire path, is then defined as the route through the space tile path from the center of the component source tile to the center of the component destination tile.

The aforementioned technique for selecting the wire paths for a VLSI circuit design suffers from two drawbacks, both of which may add to the cost of VLSI circuits manufactured in accordance with the design. First, if defined in accordance with the above-described manner, a tile path is not necessarily the optimal tile path through the clear space. Second, since the width of a tile path is typically much larger than the width of a wire path, multiple wire paths may exist through a given tile path. If the wire path located within the tile path is arbitrarily selected, the selected wire path is not necessarily the most efficient wire path potentially located within the tile path.

SUMMARY

Disclosed herein is a method and associated apparatus for the design and manufacture of VLSI circuit which incorporates therein a method for routing connections between component tiles of the VLSI circuit being designed. In accordance with the disclosed method, maximal component tile and maximal space tile lists are constructed and, from the constructed lists, the maximal component and maximal space tiles are positioned on the routing area(s). Optimal tile path and minimum cost wire path between pins that are CTs to be connected are determined and, utilizing the determined wire path, a VLSI circuit design is generated. The minimum cost path from a starting tile S to a destination tile T is determined by creating a priority queue and a search tree ST with the starting tile S as its root. While the priority queue is not empty, a low cost tile E neighboring the starting tile S is popped and, if a tile path to destination tile T is found, the cost of the tile path is evaluated and saved as the minimum cost point path. Otherwise, for each tile F neighboring the tile E, the search tree is expanded and, for a tile path having an estimated cost greater than the current cost, the search path is pruned. Otherwise, the search is expanded by adding the tile F (with corresponding minimum cost CE)) to the priority queue Q and inserting the tile F into the search tree as a child node of the tile E.

BRIEF DESCRIPTION OF THE DRAWINGS

FIGS. 3b-1 through 3b-2 are flow charts of a method, suitable for use with the method of designing and manufacturing VLSI circuits of FIG. 2, of determining an optimal tile path and minimum cost wire path between pins that are CTs to be connected.

DETAILED DESCRIPTION

Figure 1:
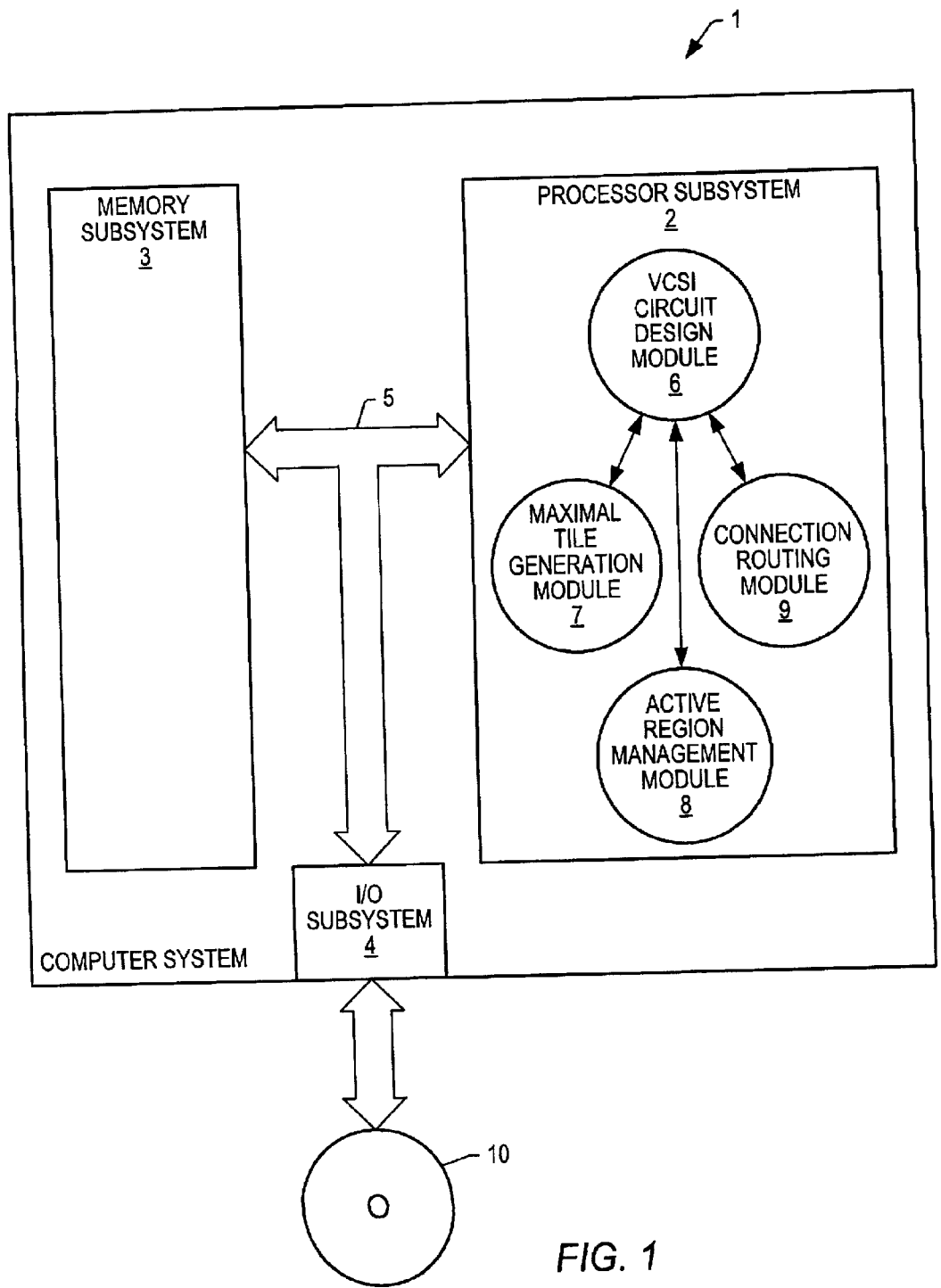
FIG. 1 is a block diagram of a computer system in which VLSI circuit design software resides.

Referring first to FIG. 1, a computer system 1, for example, a personal computer ("PC"), file server or other type of computer, in which VLSI circuit design software resides will now be described in greater detail. The computer system 1 is comprised of a processor subsystem 2, a memory subsystem 3 and an input/output ("I/O") subsystem 4 coupled together by a bus subsystem 5. The bus subsystem 5 encompasses the main system bus and any local or other types of busses that collectively couple the processor subsystem 2, the memory subsystem 3 and the I/O subsystem 4 to one another. As used herein, the terms "couple" or "coupled" refer broadly to either a direct or an indirect connection between the referenced elements.

The processor subsystem 2 encompasses the collective processing capability of the computer system 1, including the central processing unit ("CPU") as well as any secondary processing devices, for example, an arithmetic processing unit, coupled to the CPU by the bus subsystem 5. Similarly, the memory subsystem 3 encompasses the collective storage capability of the computer system 1, including main, auxiliary, cache and any other memory accessible by the processor subsystem 2 via the bus subsystem 5. Finally, the I/O subsystem 4 encompasses any and all I/O devices, for example, floppy, CD-ROM or DVD drives, coupled to the bus subsystem 5, for writing data to or reading data from the processor subsystem 2 or the memory subsystem 3. The I/O subsystem 4 also encompasses any data communications equipment ("DCE"), for example, network interface cards or modems, which couple the computer system 1 to data terminal equipment ("DTE"), for example, a second PC, file server or web server, via a local area network ("LAN"), wide area network ("WAN"), intranet, internet or other type of network.

FIG. 1 further shows plural software modules, specifically, a first software module 6 for providing the computer system 1 with VLSI circuit design functionality, a second software module 7 for providing the computer system 1 with maximal tile generation functionality, a third software module 8 for providing the computer system 1 with active region management functionality and a fourth software module 9 for providing the computer system 1 with connection routing functionality. Each of the software modules 6 through 9 is comprised of a series of instructions which are encoded in the memory subsystem 3 as computer readable program code and executable by the processor subsystem 2. Typically, the VLSI circuit design module 6, the maximal tile generation module 7, the active region management module 8 and the connection routing module 9 will be stored in the auxiliary memory of the memory subsystem 3 prior to the execution thereof. A transportable computer usable medium 10, for example, a floppy disk, CD-ROM or file transfer software, is used to copy the VLSI circuit design module 6, the maximal tile generation module 7, the active region management module 8 and the connection routing module 9 into the auxiliary memory of the memory subsystem 3.

As illustrated in FIG. 1, the functionality provided by the software modules 6 through 9 may be encoded in the memory subsystem 3 and/or the computer usable medium 10 as discrete computer programs, each containing computer readable program code. Alternately, the functionality provided by the software modules 6 through 9 may be encoded in the memory subsystem 3 and/or the computer usable medium 10 as separate subroutines of a single computer program containing plural computer readable program subcodes. Furthermore, while any of the software modules 6 through 9 may be executed separately, typically, the VLSI circuit design module 6 will be initially executed by the processor subsystem 3. The VLSI circuit design module 6 will then periodically call selected ones of the maximal tile generation module 7, the active region management module 8 and the connection routing module 9 to perform certain functions during the design of a VLSI circuit. Of course, any one of the software modules 6 through 9 may call any other one of the software modules 6 through 9 to perform certain functions on its behalf.

Figure 2:
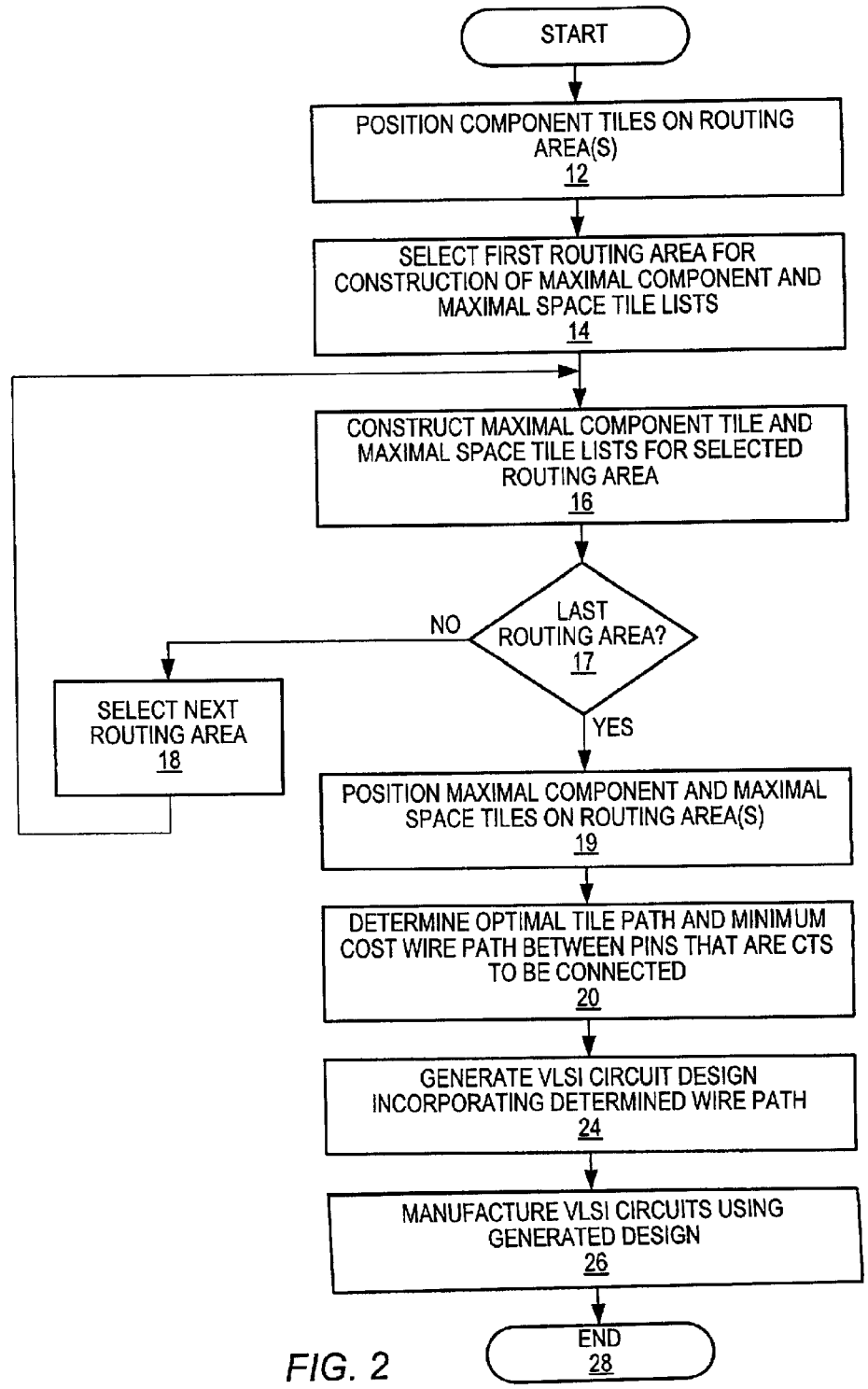
FIG. 2 is a flow chart of a method for designing and manufacturing VLSI circuits.

Referring next to FIG. 2, a method for designing and manufacturing VLSI circuits will now be described in greater detail. The method commences at step 11 with the execution of the VLSI circuit design module 6 by the processor subsystem 2. The method proceeds to step 12 where one or more routing areas are defined and a collection of component tiles are positioned on each routing area using the VLSI circuit design module 6. Generally, a routing area comprises the surface area of a layer of an integrated circuit on which component tiles are positioned. When plural routing areas are defined by the VLSI circuit design module 6, the integrated circuit being designed is a multi-layer integrated circuit and each routing area comprises the surface of a respective layer of the multi-layer integrated circuit.

Figure 4:
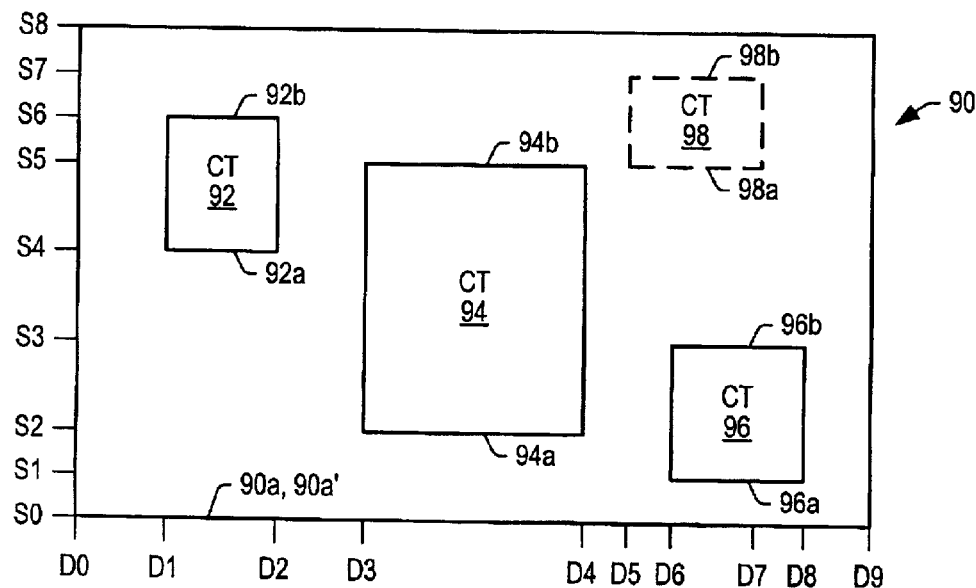
FIG. 4 is a top view of first and second routing areas, each forming a respective layer of a VLSI circuit design and having at least one component tile to be connected into a net.

For example, FIG. 4 illustrates the components tiles ("CT"s) of a multi-layer integrated circuit design having two layers. The CTs 92, 94 and 96 are positioned within a first routing area 90 of a first, or upper, layer. Also shown in FIG. 4 is CT 98, which is illustrated in phantom because it resides on a second routing area 90' of a second, or lower, layer located beneath the routing area 90. In the VLSI circuit design illustrated in FIG. 4, the CTs 92, 96 and 98, also known as pins, are on the same net while the CT 94 is an obstruction. Thus, the CTs 92, 96 and 98 must now be connected while avoiding the CT 94.

While, in the description to follow, the routing areas 90 and 90' are oftentimes described with respect to a vertical axis, hereafter termed the "S" axis, which extends from S0 to S8, and a horizontal axis, hereafter termed the "D" axis, which extends from D0 to D9, it should be clearly understood that the use of these terms is not intended to imply or suggest that the routing areas 90 and 90' have a particular orientation, either horizontal or vertical, relative to the VLSI circuit being designed. Likewise, the description of a first span (or segment thereof) of the routing areas 90 or 90' as being located above or below a second span (or segment thereof) is not intended to imply or suggest that the first and second spans are oriented in either the horizontal or vertical plane. Rather, the use of these terms is merely intended to describe their relative location within a common plane without regard to the specific orientation of that plane.

Accordingly, the method proceeds to step 14 where the first routing area 90 is selected for reconfiguration into maximal component and space tiles. The method then continues on to step 16 for construction of maximal component tile and maximal space tile lists for the routing area 90. The CTs 92, 94 and 96 of the routing area 90 are all maximal component tiles because there are no overlapping tiles or adjacent tiles on either the left or right sides thereof. However, the open space of the routing area 90 needs to be divided into one or more maximal space tiles. A suitable method to perform this operation is disclosed in co-pending U.S. patent application Ser. No. 10/109116 entitled "A Maximal Tile Generation Technique and Associated Methods of Designing and Manufacturing VLSI Circuits" and previously incorporated by reference. However, as the current example differs from that described in the above-referenced patent application in that all of the component tiles positioned on the routing area 90 are already maximal component tiles, the method set forth in the above-referenced application shall later be applied to the routing area 90 illustrated in FIG. 4.

After constructing maximal component tile and maximal space tile lists for the routing area 90 in a manner to be more fully described below, the method proceeds to step 17 where it is determined if there are additional routing area for which maximal component tile and maximal space tile lists are to be constructed. As maximal component tile and maximal space tile lists must still be constructed for the routing area 90', the method proceeds to step 18 for selection of the routing area 90' and then returns to step 16 for construction of maximal component tile and maximal space tile lists for the routing area 90'. After constructing maximal component tile and maximal space tile lists for the routing area 90' in a manner to be more fully described below, the method proceeds to step 17 where it is determined that maximal component tile and maximal space tile lists have been constructed for all routing areas. Accordingly, the method then proceeds to step 19 where the maximal component tile and maximal space tile lists constructed at step 16 are used to position the maximal component tiles and the maximal space tiles on the routing areas 90, 90'.

After positioning the maximal component and maximal space tiles on the routing areas 90, 90', the method proceeds to step 20 where the connection routing module 9 determines the optimal tile path and minimum cost wire path between pins that are CTs to be connected. Using the minimum cost wire path between pins that are CTs to be connected, the method continues on to step 24 where the positions of the CTs and the wire path interconnecting the connected CTs are used by the VLSI circuit design module 6 to produce a VLSI circuit design. It should be noted, however, that the foregoing description of a method of designing a VLSI circuit is highly simplified and that numerous steps in the process which are deemed as not being needed for an understanding of the disclosed techniques have been omitted for ease of description. Having completed the design of the VLSI circuit, the method then continues on to step 26 where plural VLSI circuits which conform to the design are manufactured at a facility using conventional manufacturing processes. The method then ends at step 28.

Figure 3A:
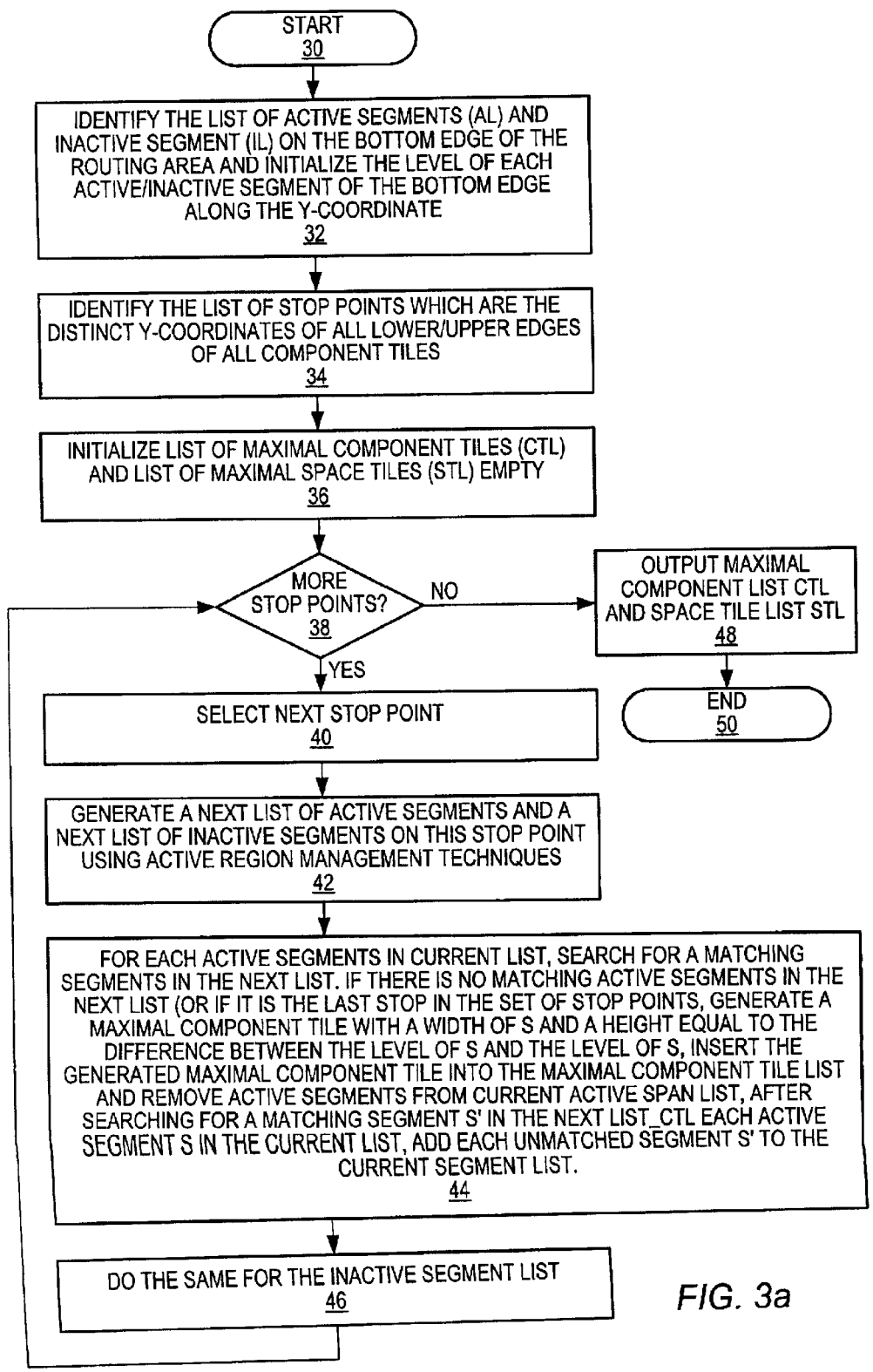
FIG. 3a is a flow chart of a method, suitable for use with the method of designing and manufacturing VLSI circuits of FIG. 2, for reconfiguring a routing area into an arrangement of maximal component tiles and maximal space tiles.

Turning now to FIG. 3a, the method by which maximal component tile and maximal space tile lists are determined for the routing area 90 at step 16 will now be described in greater detail. The method commences at step 30 and, at step 32, a list (AL) of active segments and a list (IL) of inactive segments of a span which extends along a bottom edge 90a of the routing area 90 are identified. Generally, an "active" segment of a span is a segment which passes through the interior of a component tile or along a lower edge thereof. Conversely, an "inactive" segment of a span is a segment that passes through an unoccupied portion of the routing area or along an upper edge of a component tile. Once active and inactive segments of the span have been identified, a level is then assigned to each segment thereof. The level of a segment is the point, along the S axis, generally aligned with the span of which the active or inactive segment forms a portion thereof. For example, a segment forming part of a span may be described as follows: [DX, DY, SZ] where DX is the point, along the D axis, where the active or inactive segment starts, DY is the point, along the D axis, where the active or inactive segment ends and SZ is the level, along the S axis, of the active or inactive span of which the active or inactive segment forms a portion thereof.

An active segment of a first span may be said to "match" an active segment of a second span if the segments have the same start point DX and the same stop point DY along the D axis but different levels SZ along the S axis. For example, the active segments [D1, D3, S1] and [D1, D3, S2] are considered to be matching active segments. Conversely, the term "unmatched" active segments refer to spans which, in addition to having different levels SZ, also have different start points DX, different stop points DY or both. Likewise, an inactive segment of a first span matches an inactive segment of a second span if the segments have the same start and stop points DX and DY but different levels SZ while unmatched inactive segments also have either a different start point DX, a different stop point DY or both.

A "characteristic" of a span is defined by the set of segments which comprises the span. A pair of spans may be deemed as having the same characteristic if every active and inactive segment of a first span of the span pair has a matching active or inactive segment, respectively, in a second one of the span pair. Conversely, a pair of spans may be deemed as having different characteristics if every active and inactive segment of the first span fails to have a matching active or inactive segment, respectively, in the second span.

As may be clearly seen in FIG. 4, neither a lower edge nor an interior of a component tile extends along the bottom edge 90a of the routing area 90. Accordingly, the bottom edge 90a of the routing area 90 has a span comprised of a single inactive segment which extends from D0 to D9. As may be further seen in FIG. 4, the level of the span is S0. The level of the span is hereby designated as a first stop point S0 for a set of stop points for the routing area 90 and the list of active and inactive segments of the span which extends along the bottom edge 90a of the routing area 90 and is generally aligned with the first stop point S0 may be described as follows:

AL=Φ; and

IL={[D0, D9, S0]}.

The list of ALs and the list of ILs for the span generally aligned with the first stop point S0 are hereby designated as a current list of ALs and a current list of ILs, respectively, for the routing area 90.

Continuing on to step 34, additional members of the set of stop points for the routing area 90 are identified. These additional stop points for the routing area 90 are those points along the S axis which are generally aligned with either a lower edge of one or more of the CTs 92, 94 and 96 and/or an upper edge of one or more of the CTs 92, 94 and 96. Thus, from the known arrangement of the CTs 92, 94 and 96 illustrated in FIG. 4, the maximal tile generation module 7 identifies, in an ascending order relative to the S axis, S1, S2, S3, S4, S5 and S6 as additional members of the set of stop points for the routing area 90. Finally, an upper edge 90b of the routing area 90 is designated as a last stop point S8 of the set of stop points for the routing area 90. The method then proceeds to step 36 where an empty list of maximal component tiles (CTL) and an empty list of maximal space tiles (STL) are generated.

S1, S2, S3, S4, S5 and S6 were identified as additional stop points because they are all aligned with one or more of the lower edges of the CTs 92, 94 and 96 and/or the upper edges of the CTs 92, 94 and 96. The edges of the CTs 92, 94 and 96 are used to identify additional stop points since the edges of a CT indicate transition between active and inactive regions. More specifically, a lower edge of a CT indicates the location of an inactive-to-active transition while an upper edge of a CT indicates the location of an active-to-inactive transition. The stop points are selected to coincide with either inactive-to-active or active-to-inactive transitions because, in accordance with the techniques disclosed herein and to be more fully described below, maximal component and/or space tiles are generated whenever active and/or inactive segments of a first span fails to have a matching active and/or inactive segments along a second span.

At step 38, it is determined whether there are additional stop points which require examination. If so, the method proceeds to step 40 for selection of a next stop point for examination. At step 42, a next list of active segments and a next list of inactive segments are identified for a next span generally aligned with a next stop point of the set of stop points. The lists of active and inactive segments of the span generally aligned with the next stop point are generated using the active region management techniques disclosed in co-pending U.S. patent application Ser. No. 10/109,116 entitled "Active Region Management Techniques and Associated Methods of Designing and Manufacturing VLSI Circuits" and previously incorporated by reference. Once the next list of active segments and the next list of inactive segments of the span generally aligned with the next stop point have been generated at step 42, the method proceeds to step 44 where the next list of active segments is compared to the current list of active segments and, based upon that comparison, one or more maximal component tiles may be identified for inclusion in the list of maximal component tiles.

More specifically, for each active segment S in the current list of active segments, the next list of active segments is examined for a matching active segment S'. If there is no matching active segment S' in the next list of active segments, a maximal component tile having a width generally equal to the width [DX, DY] of the active segment S and a height generally equal to the difference between the level of the active segment S and the level of the active segment S' is generated. The generated maximal component tile is then inserted into the maximal component tile list CTL and the active segment S removed from the current list of active segments. After searching for a matching active segment S' in the next active segment list for each active segment S in the current active segment list, any unmatched active segment S' in the next active segment list is added to the current active segment list. Initially, the current active segment list will contain active segments at only one level. It should be noted, however, as the next active segment lists for various levels are examined, the current active segment list will likely contain active segments at plural levels.

The method then proceeds to step 46 where the process of step 45 is repeated using the current and next list of inactive segments. By doing so, one or more maximal space tiles may be generated at step 44 and added to the maximal space tile list STL. Additionally, the current list of inactive segments will be modified by deleting the inactive segments, from the current list of inactive segments, the inactive segments having a matching inactive segment in the next list of inactive segments and by adding, to the current list of inactive segments, unmatched inactive segments from the next list of inactive segments. The method then returns to step 38 where the process described in steps 40, 42, 44 and 46 is repeated for each stop point in the set of stop points. After the last stop point in the set of stop points has been processed, the method will proceed from step 38 to step 48 where the maximal component tile list CTL and the maximal space tile list STL generated by the described method are output, typically, to the VLSI circuit design module 8 for use in connection with the design and manufacture of a VLSI circuit in accordance with the method of FIG. 2.

Figure 5:
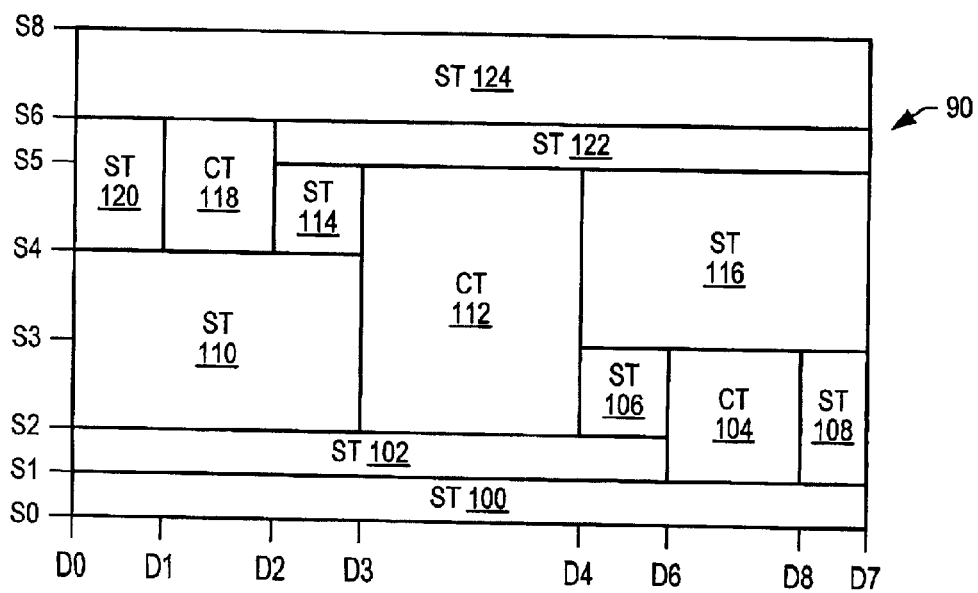
FIG. 5 is a top view of the first routing area of FIG. 4 after reconfiguration into an arrangement of maximal component tiles and maximal space tiles.

The above-described method of generating a list of maximal component tiles CTL and a list of maximal space tiles STL for the routing area 90 shall again be described, now with respect to the example illustrated in FIGS. 4 and 5. As previously noted, FIG. 4 shows the CTs 92, 94 and 96 positioned in the routing area 90. As previously set forth, the process starts at step 32 by identifying the active and inactive segments for a span extending along the bottom edge 90a of the routing area 90. As there are no active segments along the bottom edge 90a, the active and inactive segment lists for this span, which is generally aligned with the stop point S0, are initially set as follows:

AL=Φ; and

IL={[D0, D9, S0]}.

At step 34, the remaining members of the set of stop points are identified (S1, S2, S3, S4, S5, S6 and S8) and, at step 36, an empty maximal component tile list CTL and an empty maximal space tile list STL are generated. As the stop points S1, S2, S3, S4, S5, S6 and S8 need to be examined, the method passes through 38 and on to step 40 where the stop point S1, the next stop point after the stop point S0, is selected for examination. As may be seen in FIG. 4, bottom edge 96a of the CT 96 is generally aligned with the stop point S1. The corresponding segment is, therefore, considered to be active while the remaining segments generally aligned with the stop point S1 are considered to be inactive. Accordingly, at step 42, the next list of active segments and the next list of inactive segments are determined to be:

AL=Φ; and

IL={[D0, D9, S0]}.

Proceeding to step 44, the current active segment list is empty. As a result, there are no matches between the current list of active segments and the next list of active segments. As a result, no maximal component tiles are generated at step 44. Furthermore, as the entry in the next active segment list is unmatched, it is added to the current active segment list, which now becomes:

AL={[D6, D8, S1]}.

The method then proceeds to step 46 for processing of the current inactive segment list. The current inactive segment list contains a single entry [D0, D9, S0]. As there is no matching span in the next inactive segment list, a space tile, hereafter referred to as ST 100 and illustrated in FIG. 5, which extends from D0 to D9 in the D axis along a line generally aligned with S0 and which extends from S0 to S1 in the S axis is generated and added to the maximal space tile list STL. The matched entry [D0, D9, S0] is deleted from the current inactive segment list and the unmatched entries [D0, D6, S1] and [D8, D9, S1] of the next inactive segment list are added to the inactive segment list, thereby producing the following current inactive segment list:

IL={[D0, D6, S1], [D8, D9, S1]}.

The method then returns to step 38 and, as there are additional stop points to be examined, on to step 40 where stop point S2 is selected for examination.

A span extending across the routing area 90 along a line generally aligned with the stop point S2 passes along a lower edge 94a of the CT 94 and through the interior of the CT 96. Accordingly, the next list of active and inactive segments would be as follows AL={[D3, D4, S2], [D6, D8, S2]}; and

IL={[D0, D3, S2], [D4, D6, S2], [D8, D9, S2]}.

For each active segment in the current active segment list, the next active segment list is searched for matches. Here, [D6, D8, S1], currently the only entry in the current active segment, matches the [D6, D8, S2] entry from the next active segment list. Accordingly, no maximal component tiles are generated during step 44. The matched entry [D6, D8, S2] is deleted from the next active segment list while the unmatched entry [D3, D4, S2] from the next active segment list is added to the current active segment list, thereby producing the following current active segment list:

AL={[D3, D4, S2], [D6, D8, S1]}.

The method then proceeds to step 46 for processing of the current inactive segment list. The current inactive segment list contains entries [D0, D6, S1] and [D8, D9, S1] while the next inactive segment list contains entries [D0, D3, S2], [D4, D6, S2] and [D8, D9, S2]. Thus, the [D8, D9, S1] entry of the current inactive segment list is matched while the [D0, D6, S1] entry is unmatched. Accordingly, maximal space tile ST 102, which extends from D0 to D6 in the D axis along a line generally aligned with S1, extends from S1 to S2 in the S axis and is illustrated in FIG. 5, is generated and added to the maximal space tile list STL. The unmatched entry is then deleted from the current inactive segment list while the unmatched entries [D0, D3, S2] and [D4, D6, S2] of the next inactive segment list is added to the current inactive segment list, thereby producing the following current inactive segment list:

IL={[D0, D3, S2], [D4, D6, S2], [D8, D9, S1]}.

A span extending across the routing area 90 along a line generally aligned with the stop point S3 passes through the interior of the CT 94 and along an upper edge 96b of the CT 96. Accordingly, the next list of active and inactive spans would be as follows:

AL={[D3, D4, S3]}; and

IL={[D0, D3, S3], [D4, D9, S3]}.

For each active span in the current active segment list, the next active segment list is searched for matches. Here, the entry [D3, D4, S2] matches the entry [D3, D4, S3] while the entry [D6, D8, S1] is unmatched. Accordingly, the entry [D6, D8, S1] is used to generate a maximal component tile, hereafter referred to as CT 104 and illustrated in FIG. 5, which extends from D6 to D8 in the D axis along a line generally aligned with S1 and from S1 to S3 in the S axis. The newly generated maximal component tile is then added to the maximal component tile list CTL. The unmatched entry [D6, D8, S1] is deleted from the current active segment list and, since there are no unmatched entries from the next active segment list, the following current active segment list is produced:

AL={[D3, D4, S2]}.

The method then proceeds to step 46 for processing of the current inactive segment list. The current inactive segment list contains entries [D0, D3, S2], [D4, D6, S2] and [D8, D9, S1] while the next inactive segment list contains entries [D0, D3, S3] and [D4, D9, S3]. Thus, the [D4, D6, S2] and [D8, D9, S1] entries of the current inactive segment list are unmatched while the [D0, D3, S2] entry of the current inactive segment list is matched. Accordingly, the unmatched entry [D4, D6, S2] is used to generate maximal space tile ST 106, which extends from D4 to D6 in the D axis along a line generally aligned with S2, extends from S2 to S3 in the S axis and is illustrated in FIG. 5. Similarly, the unmatched entry [D8, D9, S1] is used to generate maximal space tile ST 108, which extends from D8 to D9 in the D axis along a line generally aligned with S2, extends from S1 to S3 in the S axis and is illustrated in FIG. 5. The newly generated tiles are then added to the maximal space tile list, the unmatched entries [D4, D6, S2] and [D8, D9, S1] are deleted from the current inactive segment list and the unmatched entry [D4, D9, S3] of the next inactive segment list is added to the current inactive segment list, thereby producing the following current inactive segment list:

IL={[D0, D3, S2], [D4, D9, S3]}.

The method then returns to step 38 and, as there are additional stop points to be examined, on to step 40 where stop point S4 is selected for examination.

A span extending across the routing area 90 along a line generally aligned with the stop point S4 along a lower edge 92a of the CT 92 and through the interior of the CT 94. Accordingly, the next list of active and inactive spans generated at step 42 would be as follows:

AL={[D1, D2, S4], [D3, D4, S4]}; and

IL {[D0, D1, S4], [D2, D3, S4], [D4, D9, S4]}.

The current and next active segment lists are then processed at step 44. The current active segment list is [D3, D4, S2] while the next active segment list is [D1, D2, S4], [D3, D4, S4]. Thus, [D3, D4, S2], the only member of the current active segment list, matches [D3, D4, S4] of the next active segment list while [D1, D2, S4] of the next active segment lists is unmatched. Accordingly, at step 44, no maximal component tiles are generated and no entries are deleted while [D1, D2, S4] is added to the current active segment list, thereby producing the following current active segment list:

AL={[D1, D2, S4], [D3, D4, S2]}.

The method then proceeds to step 46 for processing of the current inactive segment list. The current inactive segment list contains entries [D0, D3, S2] and [D4, D9, S3] while the next inactive segment list contains entries [D0, D1, S4], [D2, D3, S4] and [D4, D9, S4]. Thus, the [D4, D9, S3] entry of the current inactive segment list is matched to the entry [D4, D9, S4] entry of the next inactive segment list while the [D0, D3, S2] entry of the current inactive segment list and the [D0, D1, S4] and [D2, D3, S4] entries of the next inactive segment list are unmatched. Accordingly, the unmatched entry [D0, D3, S2] of the current active span is used to generate maximal space tile ST 110, which extends from D0 to D3 in the D axis along a line generally aligned with S2, extends from S2 to S4 in the S axis and is illustrated in FIG. 5. The newly generated space tile is then added to the maximal space tile list STL, the unmatched entry [D0, D3, S2] is deleted from the current inactive segment list and the unmatched entries [D0, D1, S4] and [D2, D3, S4] of the next inactive segment list is added to the current inactive segment list, thereby producing the following current inactive segment list:

IL={[D0, D1, S4], [D2, D3, S4], [D4, D9, S3]}.

The method then returns to step 38 and, as there are additional stop points to be examined, on to step 40 where stop point S5 is selected for examination.

A span extending across the routing area 90 along a line generally aligned with the stop point S5 passes through the interior of the CT 92 and along the upper edge 94b of the CT 94. Accordingly, the next list of active and inactive spans generated at step 42 would be as follows:

AL={[D1, D2, S5]; }and

IL={[D0, D1, S5], [D2, D9, S5]}.

The current and next active segment lists are then processed at step 44. The current active segment list is [D1, D2, S4] and [D3, D4, S2] while the next active segment list is [D1, D2, S5]. Thus, the [D1, D2, S4] entry of the current active segment list matches the [D1, D2, S5] entry of the next active segment list while the [D3, D4, S2] entry of the current active segment list is unmatched. Accordingly, the [D3, D4, S2] of the current active segment list is used to generate a maximal component tile, hereafter referred to as CT 112, which extends from D3 to D5 in the D axis along a line generally aligned with the stop point S4 and from the stop point S2 to the stop point S5 in the S axis, and is illustrated in FIG. 5. The newly generated maximal component tile is then added to the maximal component tile list CTL. The unmatched entry [D3, D4, S2] is then deleted from the current active segment list and the matched entry [D1, D2, S5] is deleted from the next active segment list, thereby resulting in the following current active segment list:

AL={[D1, D2, S4]}.

The method then proceeds to step 46 for processing of the current inactive segment list. The current inactive segment list contains entries [D0, D1, S4], [D2, D3, S4] and [D4, D9, S3] while the next inactive segment list contains the entries [D0, D1, S5] and [D2, D9, S5]. Thus, the [D2, D3, S4], [D4, D9, S3] entries of the current inactive segment list and the [D2, D9, S5] entry of the next inactive segment list are unmatched. Accordingly, the unmatched entry [D2, D3, S4] of the current inactive span is used to generate maximal space tile ST 114, which extends from D2 to D3 in the D axis along a line generally aligned with S4 and which extends from S4 to S5 in the S axis while the unmatched entry [D4, D9, S3] of the current inactive span is used to generate maximal space tile ST 116 which extends from D4 to D9 in the D axis along a line generally aligned with S3 and which extends from S3 to S5 in the S axis. The newly generated space tiles ST 114 and ST 116, both of which are illustrated in FIG. 5, are then added to the maximal space tile list STL, the unmatched entries [D2, D3, S4] and [D4, D9, S3] are deleted from the current inactive segment list and the unmatched entry [D2, D9, S5] of the next inactive segment list is added to the current inactive segment list, thereby producing the following current inactive segment list:

IL={[D0, D1, S4], [D2, D9, S5]}.

The method then returns to step 38 and, as there are additional stop points to be examined, on to step 40 where the stop point S6 is selected for examination.

A span extending across the routing area 90 along a line generally aligned with the stop point S6 passes along the upper edge 92b of the CT 92. Accordingly, the next list of active and inactive spans generated at step 42 would be as follows:

AL=Φ; and

IL={[D0, D9, S6]}.

The current and next active segment lists are then processed at step 44. The current active segment list is [D1, D2, S4] while the next active segment list is empty. Thus, the [D1, D2, S4] entry of the current active segment list is unmatched. Accordingly, the [D1, D2, S4] of the current active segment list is used to generate a maximal component tile, hereafter referred to as CT 118, which extends from D1 to D2 in the D axis along a line generally aligned with the stop point S4 and from the stop point S4 to the stop point S6 in the S axis, and is illustrated in FIG. 5. The newly generated maximal component tile is then added to the maximal component tile list CTL. The unmatched entry [D1, D2, S4] is then deleted from the current active segment list, thereby emptying the current active segment list and, since the next active segment list is empty as well, the current active segment list becomes the following:

AL=Φ.

The method then proceeds to step 46 for processing of the current inactive segment list. The current inactive segment list contains entries [D0, D1, S4] and [D2, D9, S5] while the next inactive segment list contains the entry [D0, D9, S6]. Thus, the [D0, D1, S4] and [D2, D9, S5] entries of the current inactive segment list and the [D0, D9, S6] entry of the next inactive segment list are unmatched. Accordingly, the unmatched entry [D0, D1, S4] of the current inactive span is used to generate maximal space tile ST 120, which extends from D0 to D1 in the D axis along a line generally aligned with S4 and which extends from S4 to S6 in the S axis while the unmatched entry [D2, D9, S5] of the current inactive span is used to generate maximal space tile ST 122 which extends from D2 to D9 in the D axis along a line generally aligned with S5 and which extends from S5 to S6 in the S axis. The newly generated space tiles ST 120 and ST 122, both of which are illustrated in FIG. 5, are then added to the maximal space tile list STL, the unmatched entries [D0, D1, S4] and [D2, D9, S5] are deleted from the current inactive segment list and the unmatched entry [D0, D9, S6] of the next inactive segment list is added to the current inactive segment list, thereby producing the following current inactive segment list:

IL={[D0, D9, S6]}.

The method then returns to step 38 and, as there are additional stop points to be examined, on to step 40 where the stop point S8 is selected for examination. The stop point S8 is generally aligned with an upper edge 90b of the routing area 90. As neither a lower edge nor an interior of a component is positioned along the upper edge 90b, the next list of active and inactive spans generated at step 42 would be as follows:

AL=Φ; and

IL={[D0, D9, S7]}.

The current and next active segment lists are then processed at step 44. The current active segment list is Φ while the next active segment list is Φ. As both the current and next active segment lists are empty, no additional maximal component tiles are generated and the current active segment list remains empty.

The method then proceeds to step 46 for processing of the current inactive segment list. The current inactive segment list contains the entry [D0, D9, S6] while the next inactive segment list contains the entry [D0, D9, S8]. While the current and inactive segment lists contain matching entries, the stop point being examined is the last stop point in the set of stop points. Accordingly, the [D0, D9, S6] entry of the current inactive segment list is used to generate a maximal space tile, hereafter referred to as maximal space tile 124, which extends from D0 to D9 in the D axis along a line generally aligned with S6, extends from S6 to S8 in the S axis and is illustrated in FIG. 5. The newly generated space tile is added to the maximal space tile list STL and the entry [D0, D9, S6] of the current inactive segment list is deleted therefrom, thereby emptying it. Further, as the entry [D0, D9, S8] was matched to the entry [D0, D9, S6], it is not added to the current inactive segment list, thereby keeping the current inactive segment list empty. The method then returns to step 38 and as all of the stop points S0 through S6 and S8 have been examined, to step 48 for output of the generated maximal component tile and maximal space tile lists CTL and STL to the VLSI circuit design module 6. The method then ends at step 50.

Figure 6:
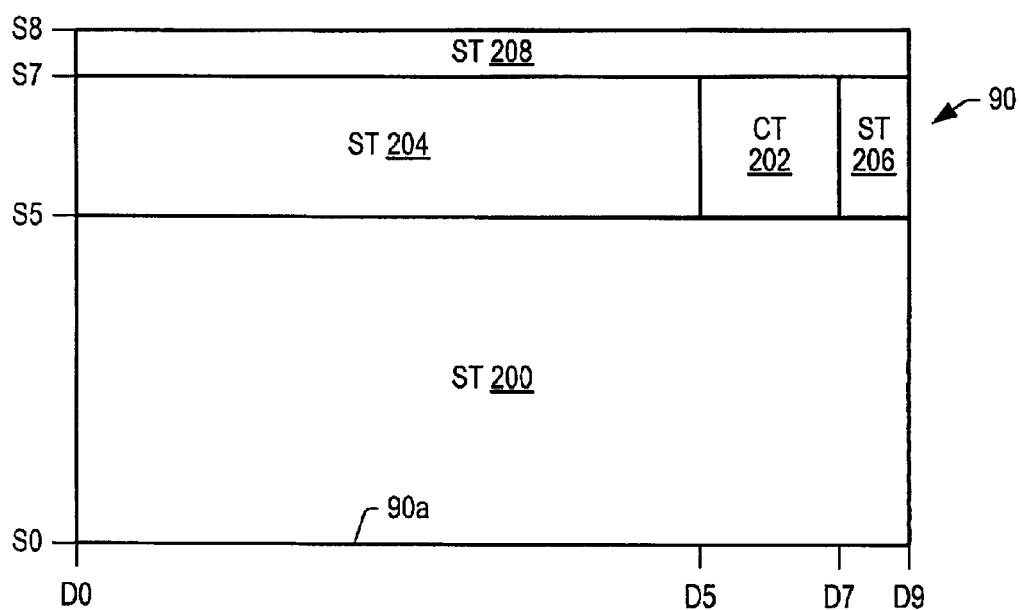
FIG. 6 is a top view of the second routing area of FIG. 4 after reconfiguration into an arrangement of maximal component tiles and maximal space tiles.

Continuing to refer to FIG. 3a, the method of generating a list of maximal component tiles CTL and a list of maximal space tiles STL for the routing area 90', shall now be described, this time, in conjunction with FIGS. 4 and 6. As previously noted, FIG. 4 shows the CT 98 positioned in the routing area 90'. As before, the process starts at step 32 by identifying the active and inactive segments for a span extending along a bottom edge 90a' of the routing area 90'. As there are no active segments along the bottom edge 90a', the active and inactive segment lists for this span, which is generally aligned with the stop point S0, are initially set as follows:

AL=Φ; and

IL={[D0, D9, S0]}.

At step 34, the remaining members of the set of stop points are identified (S5 and S7) and, at step 36, an empty maximal component tile list CTL and an empty maximal space tile list STL are generated. As the stop points S5, S7 and S8 need to be examined, the method passes through 38 and on to step 40 where the stop point S5, the next stop point after the stop point S0, is selected for examination. As may be seen in FIG. 4, bottom edge 98a of the CT 98 is generally aligned with the stop point S5. The corresponding segment is, therefore, considered to be active while the remaining segments generally aligned with the stop point S5 are considered to be inactive. Accordingly, at step 42, the next list of active segments and the next list of inactive segments are determined to be:

AL={[D5, D7, S5]}; and

IL={[D0, D5, S5], [D8, D9, S5]}.

Proceeding to step 44, the current active segment list is empty. As a result, there are no matches between the current list of active segments and the next list of active segments. As a result, no maximal component tiles are generated at step 44. Furthermore, as the entry in the next active segment list is unmatched, it is added to the current active segment list, which now becomes:

AL={[D5, D7, S5]}.

The method then proceeds to step 46 for processing of the current inactive segment list. The current inactive segment list contains a single entry [D0, D9, S0]. As there is no matching span in the next inactive segment list, a space tile, hereafter referred to as ST 200 and illustrated in FIG. 6, which extends from D0 to D9 in the D axis along a line generally aligned with S0 and which extends from S0 to S5 in the S axis is generated and added to the maximal space tile list STL. The matched entry [D0, D9, S0] is deleted from the current inactive segment list and the unmatched entries [D0, D5, S5] and [D8, D9, S5] of the next inactive segment list are added to the inactive segment list, thereby producing the following current inactive segment list:

IL={[D0, D5, S5], [D8, D9, S5]}.

The method then returns to step 38 and, as there are additional stop points to be examined, on to step 40 where stop point S7 is selected for examination.

A span extending across the routing area 90' along a line generally aligned with the stop point S7 passes along an upper edge 98b of the CT 98. Accordingly, the next list of active and inactive segments would be as follows AL=Φ; and

IL={[D0, D9, S0]}.

For each active segment in the current active segment list, the next active segment list is searched for matches. Here, [D5, D7, S5], currently the only entry in the current active segment, is unmatched. Accordingly, the entry [D5, D7, S5] is used to generate a maximal component tile, hereafter referred to as CT 202 and illustrated in FIG. 6, which extends from D5 to D7 in the D axis along a line generally aligned with S5 and from S5 to S7 in the S axis. The newly generated maximal component tile is then added to the maximal component tile list CTL. The unmatched entry [D5, D7, S5] is deleted from the current active segment list, thereby emptying it, and, since there are no unmatched entries from the next active segment list, the current active segment list remains empty as shown below:

AL=Φ.

The method then proceeds to step 46 for processing of the current inactive segment list. The current inactive segment list contains entries [D0, D5, S5] and [D7, D9, S5] while the next inactive segment list contains the entry [D0, D9, S7]. Thus, the [D0, D5, S5] and [D7, D9, S5] entries of the current inactive segment list are unmatched. Accordingly, the unmatched entry [D0, D5, S5] is used to generate maximal space tile ST 204, which extends from D0 to D5 in the D axis along a line generally aligned with S5, extends from S5 to S7 in the S axis and is illustrated in FIG. 5. Similarly, the unmatched entry [D7, D9, S5] is used to generate maximal space tile ST 206, which extends from D7 to D9 in the D axis along a line generally aligned with S5, extends from S5 to S7 in the S axis and is illustrated in FIG. 5. The newly generated tiles are then added to the maximal space tile list, the unmatched entries [D0, D5, S5] and [D7, D9, S5] are deleted from the current inactive segment list and the unmatched entry [D0, D9, S7] of the next inactive segment list is added to the current inactive segment list, thereby producing the following current inactive segment list:

IL={[D0, D9, S7]}.

The method then returns to step 38 and, as there are additional stop points to be examined, on to step 40 where stop point S8 is selected for examination. The stop point S8 is generally aligned with an upper edge 90b' of the routing area 90'. As neither a lower edge nor an interior of a component is positioned along the upper edge 90b', the next list of active and inactive spans generated at step 42 would be as follows:

AL=Φ; and

IL={[D0, D9, S0]}.

The current and next active segment lists are then processed at step 44. The current active segment list is Φ while the next active segment list is Φ. As both the current and next active segment lists are empty, no additional maximal component tiles are generated and the current active segment list remains empty.

The method then proceeds to step 46 for processing of the current inactive segment list. The current inactive segment list contains the entry [D0, D9, S7] while the next inactive segment list contains the entry [D0, D9, S8]. While the current and inactive segment lists contain matching entries, the stop point being examined is the last stop point in the set of stop points. Accordingly, the [D0, D9, S7] entry of the current inactive segment list is used to generate a maximal space tile, hereafter referred to as maximal space tile 208, which extends from D0 to D9 in the D axis along a line generally aligned with S7, extends from S7 to S8 in the S axis and is illustrated in FIG. 5. The newly generated space tile is added to the maximal space tile list STL and the entry [D0, D9, S7] of the current inactive segment list is deleted therefrom, thereby emptying it. Further, as the entry [D0, D9, S8] was matched to the entry [D0, D9, S7], it is not added to the current inactive segment list, thereby keeping the current inactive segment list empty. The method then returns to step 38 and as all of the stop points S0, S5, S7 and S8 have been examined, to step 48 for output of the generated maximal component tile and maximal space tile lists CTL and STL to the VLSI circuit design module 6. The method then ends at step 50.

Figures 1, 3B:
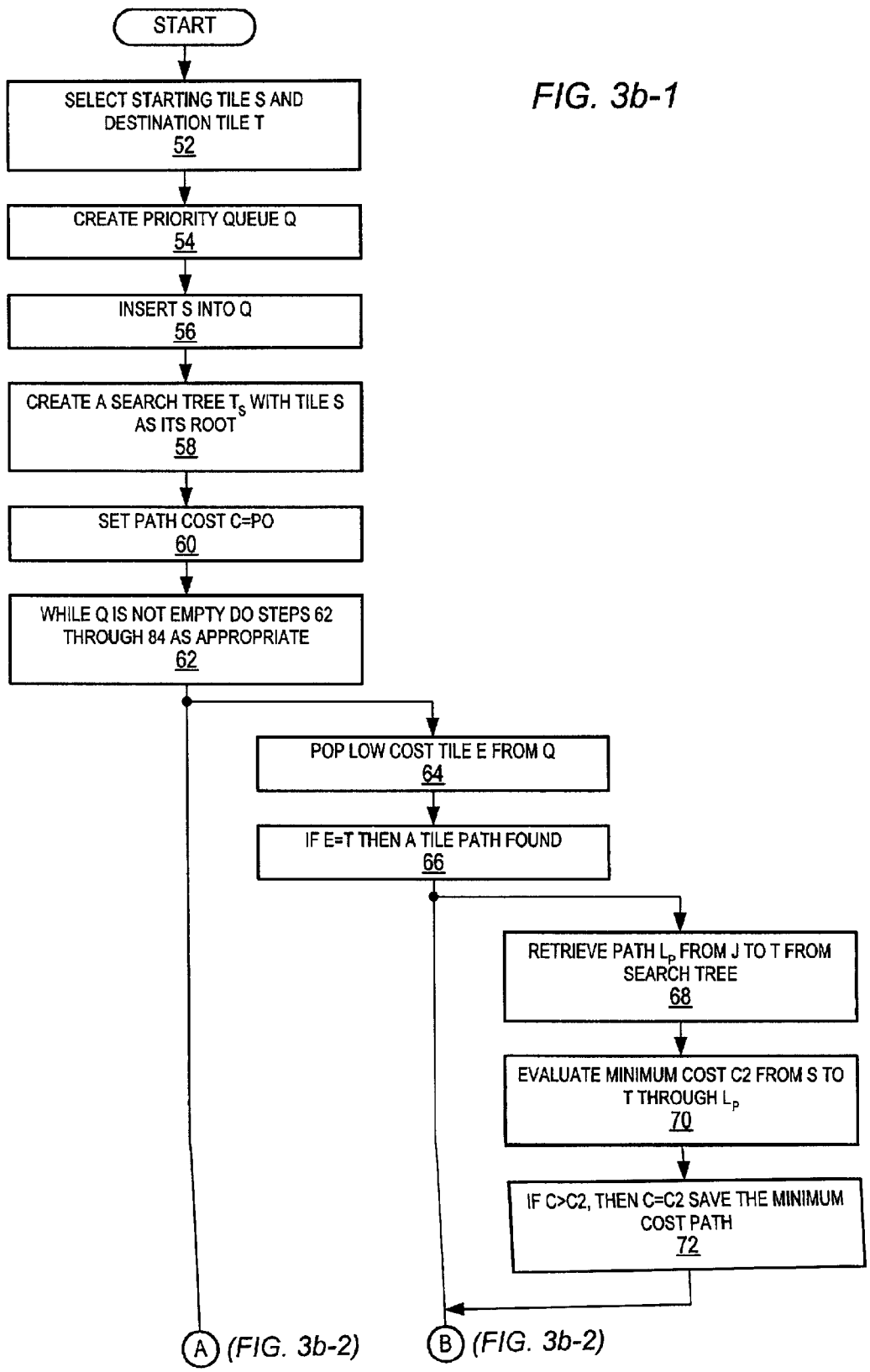
Figures 2, 3B:
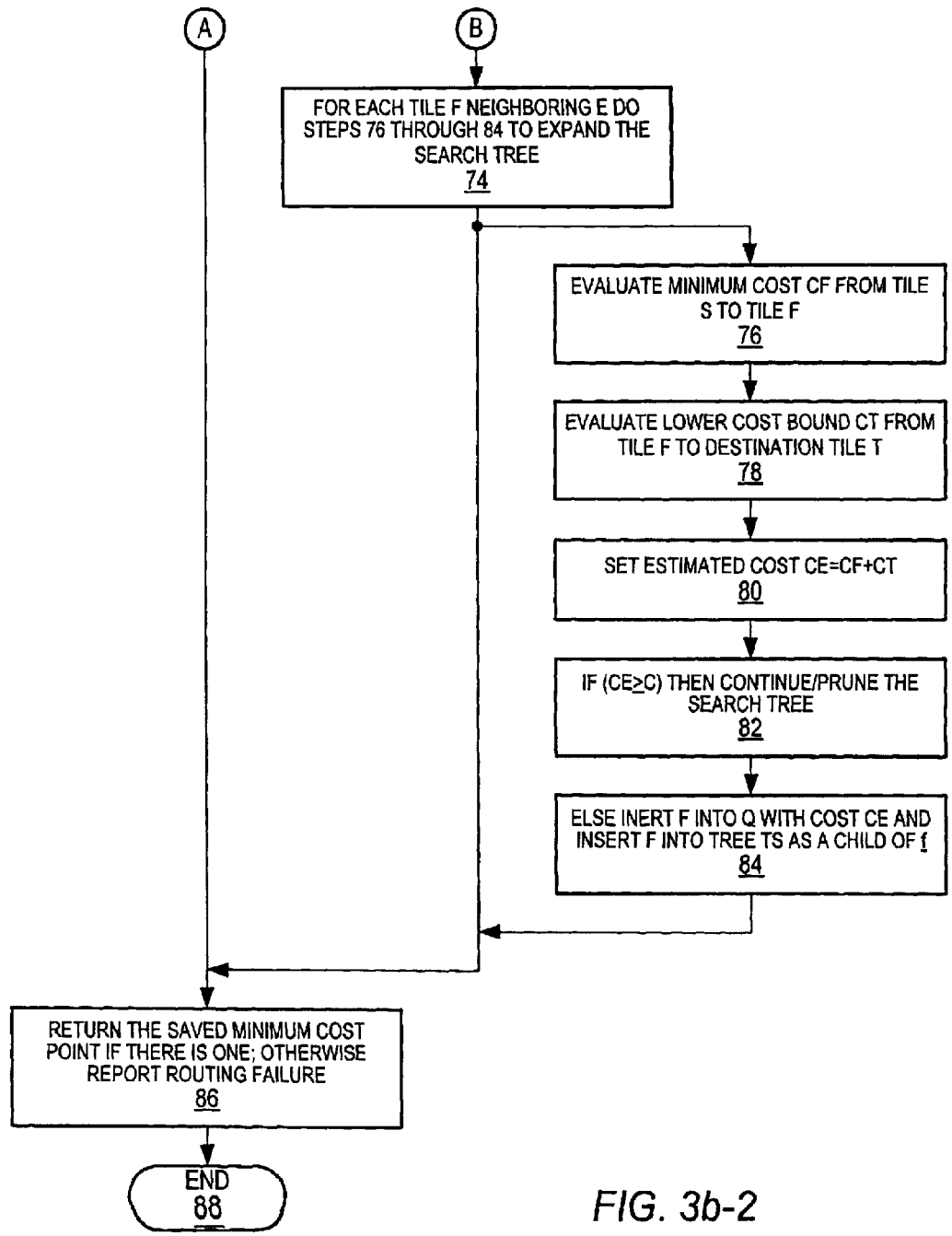

Referring next to FIGS. 3b-1 through 3b-2, the method of determining an optimal tile path and minimum cost wire path between pins that are CTs to be connected will now be described in greater detail. From the application of the method of FIG. 3a to the routing areas illustrated in FIG. 4, it has been determined that the CTs 118, 104 and 202 are pins to be connected while the CT 112 is an obstruction to be avoided. The method commences at step 50 and, at step 52, a starting tile S and a destination tile T are selected from amongst the CTs 118, 104 and 202. The method then proceeds on to step 54 where a priority queue Q is created and to step 56 where the starting tile S is inserted into the priority queue Q. The method then continues on to step 58, where a search tree ST having the starting tile S as its root is generated and on to step 60 where an initial path cost C between starting tile S and destination tile T is set to infinity.

Proceeding on to step 62, while the priority queue Q is not empty, steps 64 through 84 are executed as appropriate. Accordingly, the method either proceeds to step 64 or to step 86 described below. Here, as the priority queue Q currently holds the starting tile S, the method proceeds on to step 64 where the lowest cost tile E is popped from the priority queue Q. To appreciate which tile is the lowest cost tile E to be popped from the priority queue Q, a brief illustration shall be necessary. Assume, for example, that the CT 118 is selected as the starting tile S and the CT 104 is selected as the destination tile T. There are seven tiles E, specifically, the tiles ST 120, ST 124, ST 122, ST 114, ST 110, ST 200 and ST 204, that adjoin the tile CT 118. The distance from each tile E to the destination tile T is evaluated and the tile E closest to the destination tile T is popped from the priority queue as the lowest cost tile E. In the foregoing example, of the seven tiles E, the ST 200 is the only tile adjoining the destination tile CT 104. Thus, as the tile ST 200 is closest to the destination tile CT 104, the tile ST 200 is popped at step 64 as the lowest cost tile E.

Proceeding on to step 66, if the tile E popped from the priority queue is the destination tile T, steps 68, 70 and 72 are executed. Otherwise, the method proceeds to step 74, below. More specifically at step 68, a tile path LP from the starting tile S to the destination tile T is retrieved from the search tree TS. At step 70, the minimum cost C2 from the starting tile S to the destination tile T is evaluated and, at step 72, if the current cost C exceeds the evaluated minimum cost C2, then C is set to C2 and the minimum cost point path is saved.

Proceeding on to step 74 for each tile F neighboring the tile E, steps 76 through 84 are executed to expand the search tree. At step 76, a minimum cost CF from the starting tile T to the tile F is evaluated and, at step 78, a lower cost bound CT from the tile F to the destination tile T is evaluated. At step 80, an estimated cost CE is set as the sum of CF and CT and, at step 82 if CE is greater than or equal to the current cost C, then the method continues and the search tree TS is pruned. Otherwise, as set forth in step 84, the tile F is inserted into the priority queue Q with the estimated cost CE and the tile F is inserted into the tree TS as a child of the tile E. The method then proceeds to step 86 where, the saved minimum cost (if determined) is returned. Otherwise a routing failure is reported. The method then ends at step 88.

The input to the above-referenced algorithm is the list of space tiles created by the method of FIG. 3a, a start tile S and a destination tile T. The output is the list of points for the minimum cost routing path. We maintain a priority queue Q and a search tree TS, where Q is initially set to S and S is set to the root of the search tree TS. When no point path has been found, the path cost is set to infinity. As illustrated herein, the search terminates only when the priority queue Q is empty. In every search, one tile E is popped from the priority queue Q. If the tile E is the destination tile T, then the minimum cost path from the root of the search tree to the destination tile T is evaluated and the cost compared with saved cost. An update is performed if a lower cost path is found and the corresponding path is saved. Steps 66 through 72 perform this task. Steps 74 through 84 expand the search and prune the branch. Process the neighbor tiles F of the tile E one by one. For each such tile F, CF, the minimum cost from S to F and CT, the lower bound cost to T are evaluated. The cost from S to T through this path cannot be lower than estimated CE=CF+CT. If this estimated cost is higher than the current cost C, then prune this search path; otherwise expand the search by adding tile F into tree TS as a child node of E.

Thus, there has been described and illustrated herein, various methods suitable for use in conjunction with the design and manufacture of VLSI circuits. However, those skilled in the art should recognize that numerous modifications and variations may be made in the techniques disclosed herein without departing substantially from the spirit and scope thereof, which is defined solely by the claims appended hereto.

What is claimed is:

1. For a routing area having a plurality of component tiles positioned thereon in a non-maximal arrangement, a method for determining an optimal tile path between a starting tile and a destination tile, comprising:

characterizing a first span which extends across said routing area;

identifying a next span which extends across said routing area and has a characterization different from said first span;

generating one or more maximal component tiles and/or one or more maximal space tiles based upon differences between said characterization of said first span and said characterization of said next span;

recharacterizing said first span based upon said generated maximal component tiles and said generated maximal space tiles;

repeatedly identifying a next span, generating one or more component tiles and/or maximal space tiles and recharacterizing said first span until said routing area is fully populated with maximal component tiles and maximal space tiles;

identifying first and second ones of said maximal component tiles as a starting tile S and a destination tile T, respectively; and determining a low cost path between said starting tile S and said destination tile T.

2. The method of claim 1, wherein determining a low cost path between said starting tile S and said destination tile T further comprises:

selecting a low cost tile E from plural tiles which adjoin said starting tile S;

if said low cost tile E is said destination tile T, identifying said low cost tile E as said low cost tile path between said starting tile S and said destination tile T.

3. The method of claim 2, wherein selecting a low cost tile E from plural tiles adjoining said starting tile S further comprises:

determining a distance between each one of said plural tiles adjoining said starting tile S and said destination tile T; and selecting, as said low cost tile E, the tile closest to said destination tile T.

4. The method of claim 3, wherein identifying said low cost tile E as said low cost tile path between said starting tile S and said destination tile T further comprises:

setting an initial path cost;

determining a path cost from starting tile S to destination tile T along said low cost tile E; and identifying said low cost tile E as said low cost tile path between said starting tile S and said destination tile T if said determined path cost is less than said initial path cost.

5. The method of claim 1, wherein determining a low cost path between said starting tile S and said destination tile T further comprises:

setting a path cost;

selecting a low cost tile E from plural tiles which adjoin said starting tile S;

if said low cost tile E is said destination tile T, identifying said low cost tile E as said low cost tile path between said starting tile S and said destination tile T;

if said low cost tile E is not said destination tile T, for each tile F adjoining said low cost tile T:

selecting a tile F which adjoins said low cost tile E;

determining a minimum cost CF from said starting tile S to said selected tile F;

determining a lower cost bound CT from said selected tile F to said destination tile T; and summing said minimum cost CF and said lower cost bound CT to determine an estimated cost CE;

if said estimated cost CE is less than said path cost, setting said estimated cost to be said path cost.

6. The method of claim 5, and further comprising:

constructing a search tree ST having said starting tile S as its root;

expanding said search tree ST to include plural tile paths which extend from said starting tile T, through said low cost tile E, and to said plural adjoining tiles F thereof;

pruning, from said search tree, tile paths for which said estimated cost CE is greater than said path cost; and if said estimated cost CE for said tile F is less than said path cost, adding said tile F to said search tree ST as a child node of said low cost tile E.

7. The method of claim 6, wherein characterizing a first span across said routing area further comprises identifying active and inactive segments of said first span.

8. The method of claim 7, wherein generating one or more maximal component tiles and/or maximal space tiles further comprises:

identifying active and inactive segments of said next span;

for each identified active segment of said first span, determining if an active segment of said next span matches said identified active segment of said first span;

for each identified active segment of said first span not having a matching active segment in said next span, generating a maximal component tile having a width generally equal to a width of said identified active segment of said first span and a height generally equal to a distance separating said first span and said next span;

for each identified inactive segment of said first span, determining if an inactive segment of said next span matches said identified inactive segment of said first span; and for each identified inactive segment of said first span not having a matching inactive segment in said next span, generating a maximal space tile having a width generally equal to a width of said identified inactive segment of said first span and a height generally equal to the distance separating said first span and said next span.

9. The method of claim 8, wherein recharacterizing said first span based upon said generated maximal component tiles and said generated maximal space tiles further comprises:

deleting, from said first span, each identified active segment having a matching active segment in said next span;

adding, to said first span, each unmatched active segment of said next span;

deleting, from said first span, each identified inactive segment having a matching inactive segment in said next span; and adding, to said first span, each unmatched inactive segment of said next span.

10. For a routing area having a plurality of component tiles positioned thereon in a first maximal arrangement and a plurality of space tiles positioned thereon in a second maximal arrangement, a method for determining an optimal tile path between a starting tile and a destination tile, comprising:

identifying first and second ones of said maximal component tiles as a starting tile S and a destination tile T, respectively;

selecting a low cost tile E from plural tiles which adjoin said starting tile S;

if said low cost tile E is said destination tile T, identifying said low cost tile E as said low cost tile path between said starting tile S and said destination tile T;

setting a path cost;

selecting a low cost tile E from plural tiles which adjoin said starting tile S;

if said low cost tile E is not said destination tile T, for each tile F adjoining said low cost tile T:
- selecting a tile F which adjoins said low cost tile E;
- determining a minimum cost CF from said starting tile S to said selected tile F;
- determining a lower cost bound CT from said selected tile F to said destination tile T; and
- summing said minimum cost CT and said lower cost bound CF to determine an estimated cost CE;
- if said estimated cost CE is less than said path cost, setting said estimated cost to be said path cost; and
- determining that the path corresponding to said estimated cost CE which is less than said path cost is said low cost path between said starting tile S and said destination tile T.

11. The method of claim 10, and further comprising:

constructing a search tree ST having said starting tile S as its root;

expanding said search tree ST to include plural tile paths which extend from said starting tile T, through said low cost tile E, and to said plural adjoining tiles F thereof;

pruning, from said search tree, tile paths for which said estimated cost CE is greater than said path cost; and if said estimated cost CE for said tile F is less than said path cost, adding said tile F to said search tree ST as a child node of said low cost tile E.

12. The method of claim 11, wherein selecting a low cost tile E from plural tiles adjoining said starting tile S further comprises:
- determining a distance between each one of said plural tiles adjoining said starting tile S and said destination tile T; and
- selecting, as said low cost tile E, the tile closest to said destination tile T.

13. The method of claim 12, wherein identifying said low cost tile E as said low cost tile path between said starting tile S and said destination tile T further comprises:
- setting an initial path cost;
- determining a path cost from starting tile S to destination tile T along said low cost tile E; and
- identifying said low cost tile E as said low cost tile path between said starting tile S and said destination tile T if said determined path cost is less than said initial path cost.

14. A computer system, comprising:

a memory subsystem;

a processor subsystem;

a bus subsystem, said bus subsystem coupling said memory subsystem and said processor subsystem for exchange of signals therebetween; and a VLSI circuit design module, said VLSI circuit design module stored in said memory subsystem and executable by said processor subsystem;

said VLSI circuit design module comprising:
- means for configuring a routing area for a layer of a VLSI circuit design, said routing area having a plurality of component tiles positioned thereon;
- means for reconfiguring said plurality of component tiles positioned on said routing area for a layer of a VLSI circuit design into a plurality of maximal component tiles and a plurality of maximal space tiles;
- means for identifying a first one of said plurality of maximal component tiles as a starting tile S and for identifying a second one of said plurality of maximal component tiles as a destination tile T; and
- means for determining a low cost path between said starting tile S and said destination tile T.

15. The computer system of claim 14 wherein said means for determining a low cost path between said starting tile S and said destination tile T further comprises:
- means for constructing a search tree ST having said starting tile S as its root;
- means for expanding said search tree ST to include plural tile paths;
- means for determining a cost associated with each of said plural tile paths of said search tree ST; and
- means for pruning, from said search tree ST, tile paths having an excessive cost associated therewith.

* * * * *